United States Patent
Ryu et al.

(10) Patent No.: US 12,243,803 B2
(45) Date of Patent: Mar. 4, 2025

(54) THERMAL INTERFACE MATERIAL, METHOD OF MANUFACTURING THE SAME, AND SEMICONDUCTOR PACKAGES INCLUDING THE SAME

(71) Applicant: Samsung Electronics Co., Ltd., Suwon-si (KR)

(72) Inventors: Seunggeol Ryu, Seoul (KR); Seokkan Ki, Suwon-si (KR); Youngsuk Nam, Yongin-si (KR); Jaechoon Kim, Incheon (KR); Bangweon Lee, Yongin-si (KR); Seungtae Hwang, Seoul (KR)

(73) Assignees: SAMSUNG ELECTRONICS CO., LTD.; UNIVERSITY-INDUSTRY COOPERATION GROUP OF KYUNG HEE UNIVERSITY

( * ) Notice: Subject to any disclaimer, the term of this patent is extended or adjusted under 35 U.S.C. 154(b) by 0 days.

(21) Appl. No.: 18/437,385

(22) Filed: Feb. 9, 2024

(65) Prior Publication Data
US 2024/0186215 A1 Jun. 6, 2024

Related U.S. Application Data

(63) Continuation of application No. 17/209,974, filed on Mar. 23, 2021, now Pat. No. 11,935,812.

(30) Foreign Application Priority Data

Aug. 3, 2020 (KR) .................... 10-2020-0096919

(51) Int. Cl.
H01L 23/373 (2006.01)
H01L 23/473 (2006.01)

(52) U.S. Cl.
CPC ........ *H01L 23/3736* (2013.01); *H01L 23/473* (2013.01)

(58) Field of Classification Search
None
See application file for complete search history.

(56) References Cited

U.S. PATENT DOCUMENTS

| | | | |
|---|---|---|---|
| 5,170,930 | A | 12/1992 | Dolbear et al. |
| 5,198,189 | A | 3/1993 | Booth et al. |
| 6,624,224 | B1 | 9/2003 | Misra |
| 7,063,127 | B2 | 6/2006 | Gelorme et al. |
| 7,348,665 | B2 | 3/2008 | Sauciuc et al. |
| 7,952,193 | B2 | 5/2011 | Furman et al. |

(Continued)

FOREIGN PATENT DOCUMENTS

| | | |
|---|---|---|
| CN | 110643331 B | 11/2021 |
| WO | 2005053021 A2 | 6/2005 |

*Primary Examiner* — Kyoung Lee
(74) *Attorney, Agent, or Firm* — Muir Patent Law, PLLC

(57) ABSTRACT

A method of manufacturing a thermal interface material may include mixing fine particles with an acidic solution to remove a first oxide layer from a surface of each of the fine particles, injecting a liquid metal into the acidic solution to remove a second oxide layer from a surface of the liquid metal and for the fine particles from which the first oxide layer is removed in the acidic solution to penetrate into the liquid metal from which the second oxide layer is remove, and extracting the liquid metal including the fine particles therein from the acidic solution.

20 Claims, 13 Drawing Sheets

(56) References Cited

U.S. PATENT DOCUMENTS

| | | |
|---|---|---|
| 8,944,142 B2 | 2/2015 | Nikrityuk et al. |
| 9,693,480 B2 | 6/2017 | Salat et al. |
| 9,831,211 B2 * | 11/2017 | Chu ........................ H01B 1/22 |
| 10,392,518 B2 | 8/2019 | Chu et al. |
| 2020/0058571 A1 | 2/2020 | Wang et al. |

* cited by examiner

THERMAL INTERFACE MATERIAL, METHOD OF MANUFACTURING THE SAME, AND SEMICONDUCTOR PACKAGES INCLUDING THE SAME

CROSS-REFERENCE TO RELATED APPLICATION

This application claims priority under 35 USC § 119 to Korean Patent Application No. 10-2020-0096919, filed on Aug. 3, 2020 in the Korean Intellectual Property Office (KIPO), the contents of which are herein incorporated by reference in their entirety.

BACKGROUND

1. Field

Example embodiments relate to a thermal interface material, a method of manufacturing the same, and a semiconductor package including the same.

2. Description of the Related Art

Recently, heat generated by semiconductor packages has rapidly been increasing due to improvement of performance of semiconductor modules. Accordingly, interfacial thermal resistance between semiconductor devices, heat dissipation members and heat sinks increases, thereby causing a fatal decrease in a cooling performance of the semiconductor packages. Therefore, it is beneficial to use a thermal interface material (TIM) having high thermal conductivity in order to decrease the interfacial thermal resistance of the semiconductor packages.

SUMMARY

Example embodiments provide a method of manufacturing a thermal interface material having improved thermal conductivity.

Example embodiments provide a thermal interface material having improved thermal conductivity.

Example embodiments provide a semiconductor package including a thermal interface material having improved thermal conductivity.

According to example embodiments, there is provided a method of manufacturing a thermal interface material. The method of manufacturing a thermal interface material may include mixing fine particles with an acidic solution to remove a first oxide layer from a surface of each of the fine particles, injecting a liquid metal into the acidic solution to remove a second oxide layer from a surface of the liquid metal and for the fine particles from which the first oxide layer is removed in the acidic solution to penetrate into the liquid metal from which the second oxide layer is remove, and extracting the liquid metal including the fine particles therein from the acidic solution.

According to example embodiments, there is provided a thermal interface material. The thermal interface material may include liquid metal and fine particles disposed inside the liquid metal. The fine particles have no oxide layer on a surface thereof. A volume percentage of the fine particles in the liquid metal including the fine particles therein is about 1% to about 5%. A thermal conductivity of the liquid metal including the fine particles therein is equal to or more than about 40 W/m·K.

According to example embodiments, there is provided a semiconductor package. The semiconductor package may include a package substrate, a semiconductor chip on the package substrate, a heat dissipation member on the semiconductor chip, and a first thermal interface material coated on an upper surface of the semiconductor chip to bond the semiconductor chip and the heat dissipation member. The first thermal interface material includes a liquid metal and fine particles disposed inside the liquid metal. The fine particles have no oxide layer on a surface thereof. A volume percentage of the fine particles in the liquid metal including the fine particles therein is about 1% to about 5%. A thermal conductivity of the liquid metal including the fine particles therein is equal to or more than about 40 W/m·K.

According to example embodiments, there is provided a semiconductor package. The semiconductor package may include a package substrate, a semiconductor chip on the package substrate, a heat dissipation member on the semiconductor chip, a first thermal interface material coated on an upper surface of the semiconductor chip to bond the semiconductor chip and the heat dissipation member, a heat sink disposed on the heat dissipation member, and a second thermal interface material coated on an upper surface of the heat dissipation member to bond the heat dissipation member and the heat sink. The first and second thermal interface materials include a liquid metal including about 60 wt % to about 80 wt % gallium (Ga), about 12 wt % to about 40 wt % indium (In), and about 0 wt % to about 20 wt % tin (Sn) and fine particles disposed inside the liquid metal. The fine particles have no oxide layer on a surface thereof and each of the fine particles have a diameter of about 20 nm to about 100 μm. A volume percentage of the fine particles in the liquid metal including the fine particles therein is about 1% to about 5%. A thermal conductivity of the liquid metal including the fine particles therein is equal to or more than about 40 W/m·K.

In a method of manufacturing a thermal interface material according to example embodiments, oxide layers on fine particles and an oxide layer on a surface of a liquid metal may be removed by an acidic solution, so that the fine particles may easily penetrate into the liquid metal. Accordingly, the thermal interface material may include the liquid metal and the fine particles having a higher thermal conductivity than the liquid metal, and thus may have an improved thermal conductivity, and further may have a good interfacial adhesion, a low thermal resistance, and an improved high temperature stability.

Accordingly, a semiconductor package including the thermal interface material may have an improved cooling performance.

DETAILED DESCRIPTION OF EMBODIMENTS

Example embodiments will be more clearly understood from the following detailed description taken in conjunction with the accompanying drawings.

Figure 4:
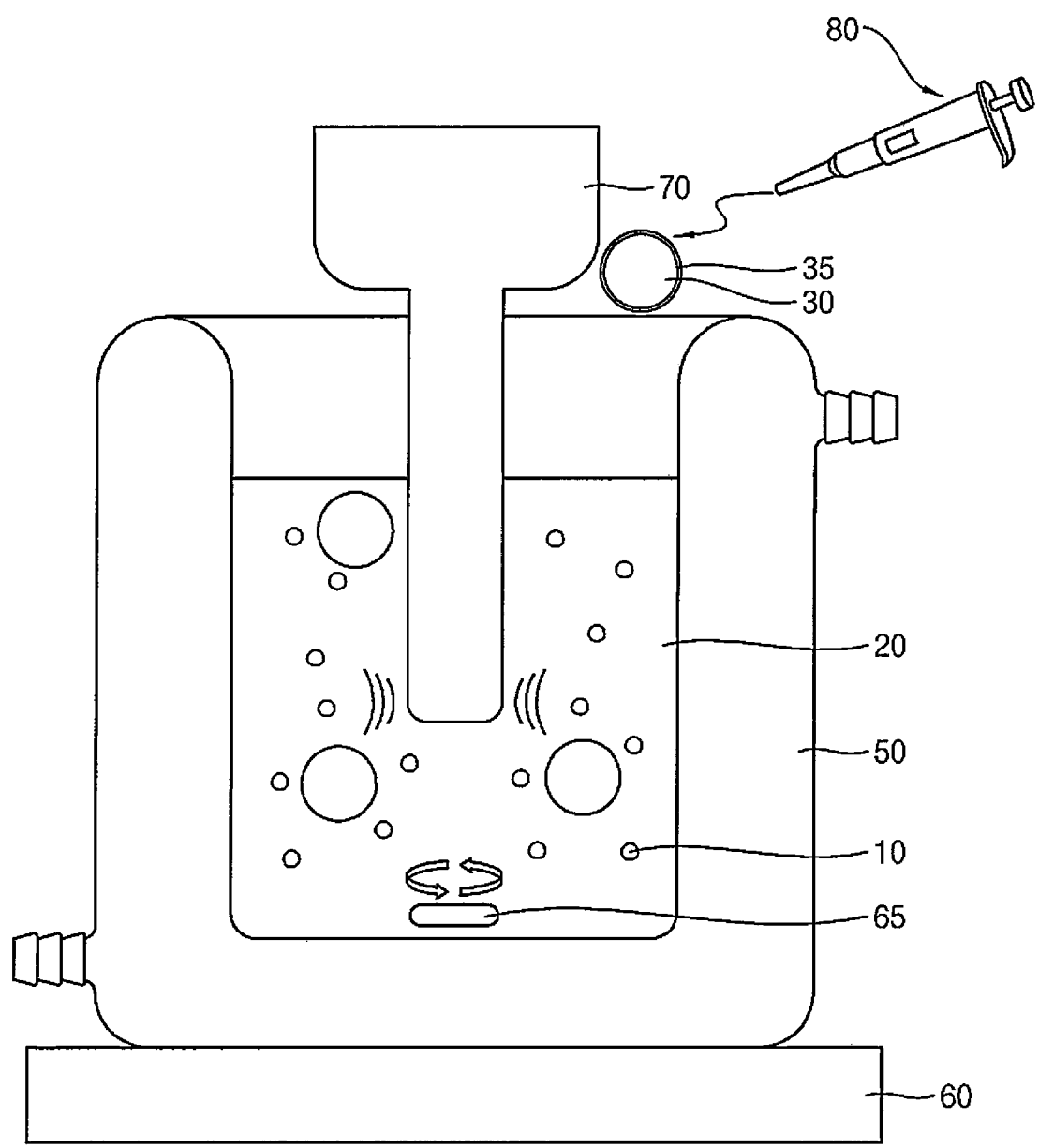
Figure 5:
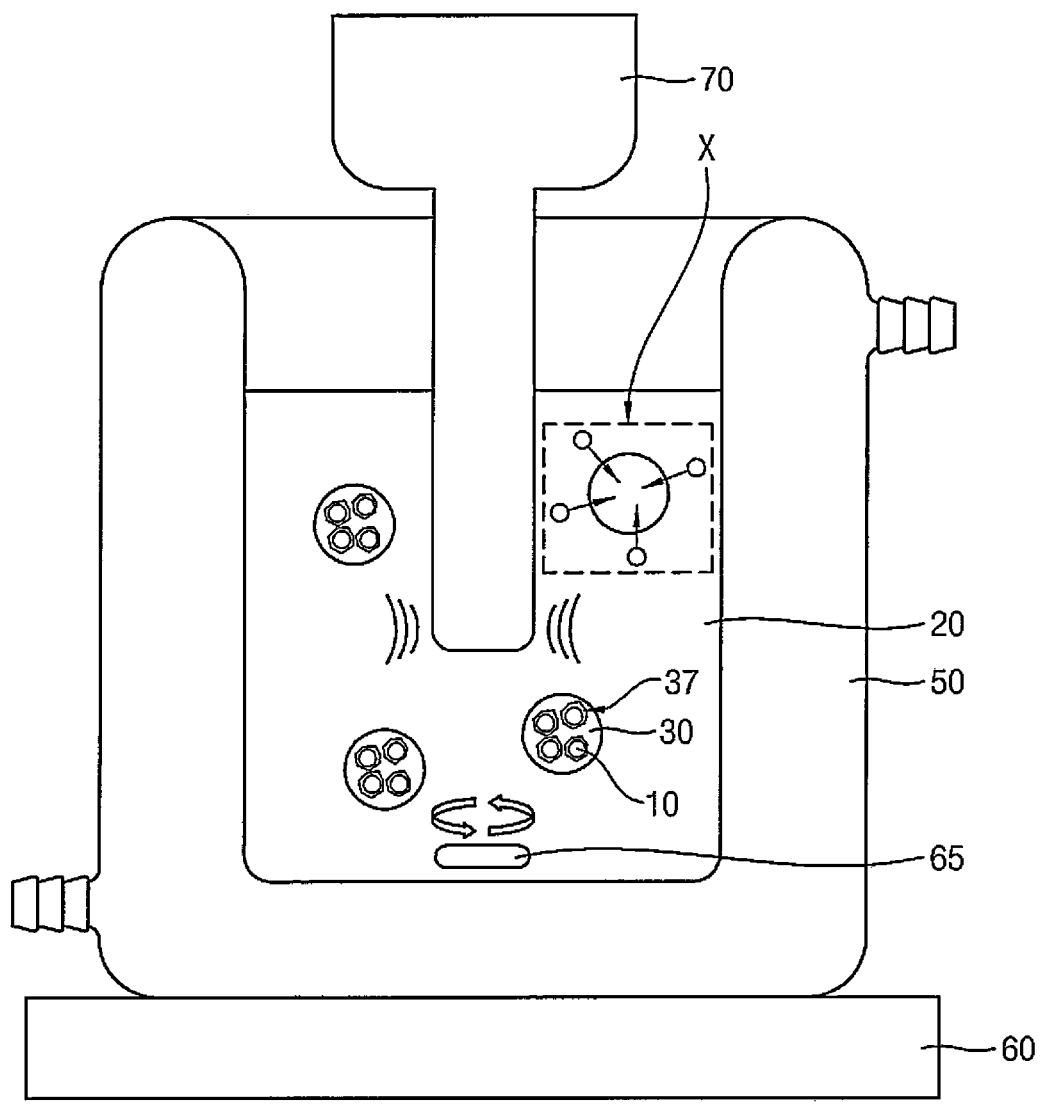
Figure 6:
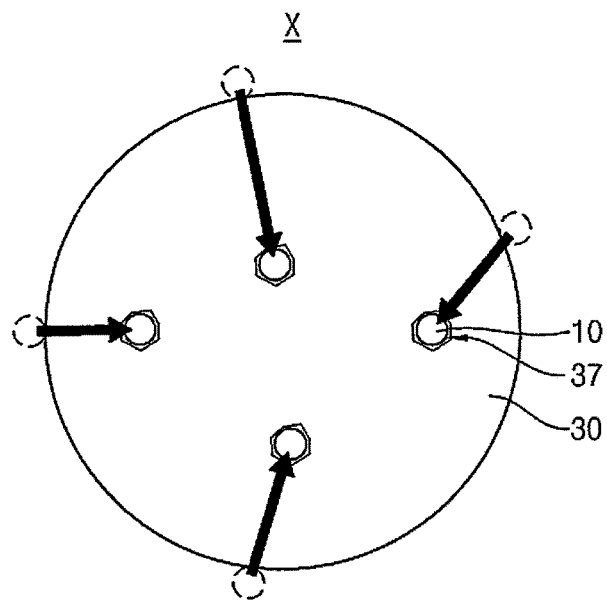

FIGS. 1 to 8 are cross-sectional views illustrating a method of manufacturing a thermal interface material in accordance with example embodiments. FIG. 6 is a view of an area X of FIG. 5, which is a schematic diagram illustrating phagocytosis on fine particles of a liquid metal.

Figure 1:
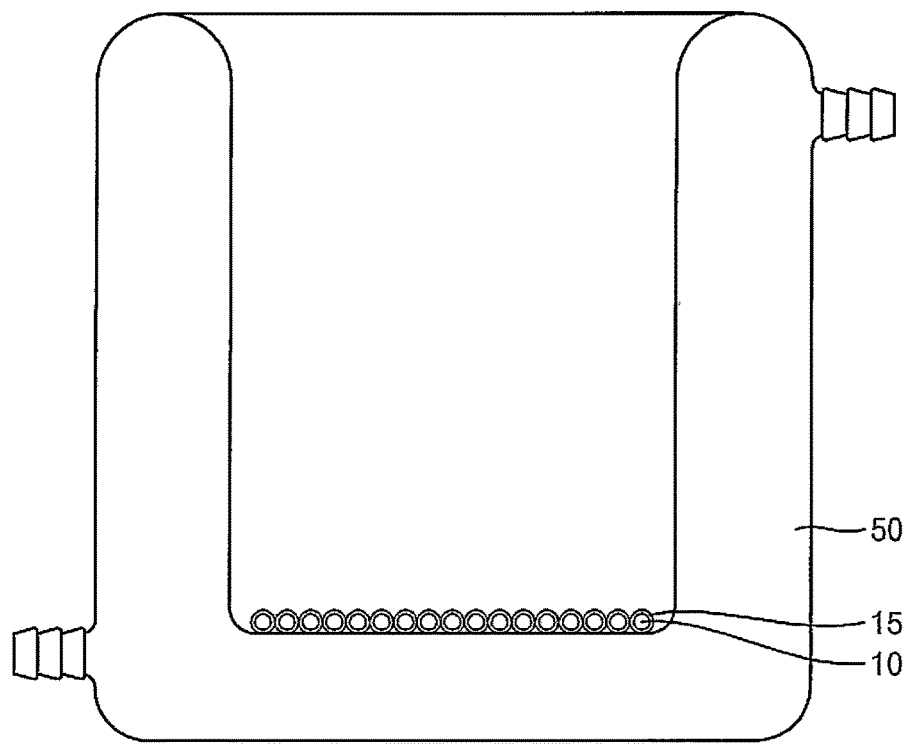
FIGS. 1 to 8 are cross-sectional views illustrating a method of manufacturing a thermal interface material in accordance with example embodiments.

Referring to FIGS. 1, fine particles 10 may be prepared.

The fine particles 10 may be prepared, e.g., in a double beaker or a container 50. In one embodiment, a temperature of the double beaker 50 may be maintained at about 13° C. For example, the double beaker or the container 50 in which the fine particles 10 are prepared may be configured such that the temperature of the fine particles 10 is controlled, e.g., to a predetermined temperature.

The fine particles 10 may be exposed to the atmosphere, and accordingly, a first oxide layer 15 may be formed on a surface of each of the fine particles 10. For example, the fine particles 10 may be exposed to ambient air before and/or after the fine particles 10 are disposed in the beaker or the container 50 so that a first oxide layer 15 may be formed on each of the fine particles 10. For example, the formation of the first oxide layer 15 on the fine particles 10 may be unintentional.

In example embodiments, the fine particles 10 may have a thermal conductivity greater than that of a liquid metal 30 (see FIG. 4) to be injected later. In example embodiments, the fine particles 10 may include or may be formed of, e.g., copper (Cu) or silver (Ag). Copper and silver may have high thermal conductivities of about 400 W/m·K and 429 W/m·K, respectively, and may be absorbed into the liquid metal 30 injected thereafter. Each of the fine particles 10 may be, e.g., spherical or elliptical, and may have a diameter of about 20 nm to about 100 μm. For example, each of the fine particles 10 may be a nano particle or a micro particle.

FIG. 1 shows that 16 fine particles 10 are prepared in the double beaker 50, however, the inventive concept is not limited thereto. A smaller or larger number of the fine particles 10 may be prepared in the double beaker 50.

Figure 2:
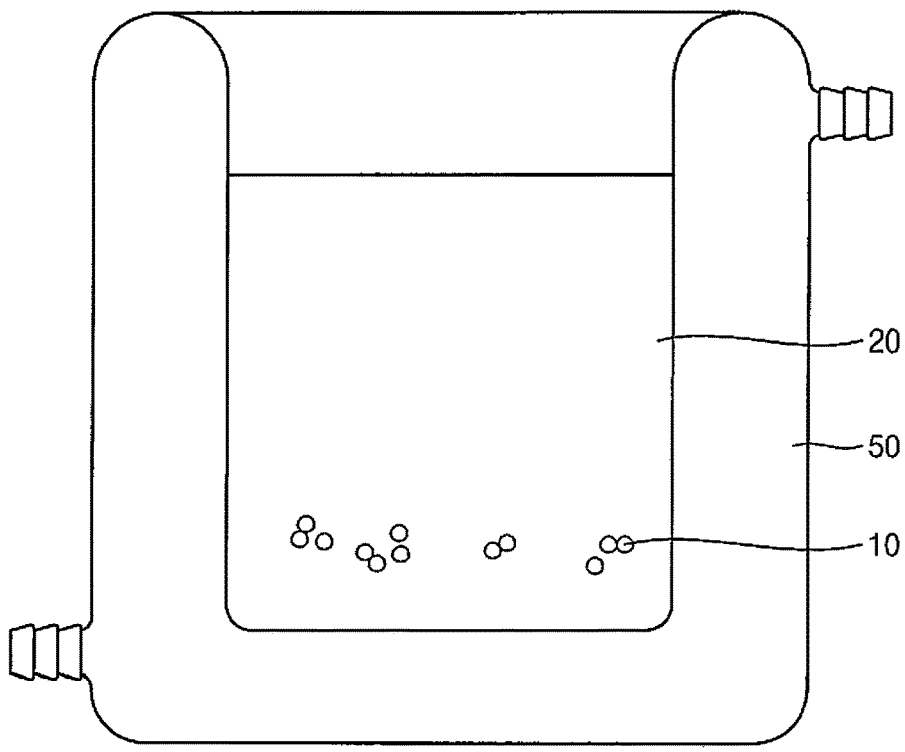

Referring to FIG. 2, an acidic solution 20 may be provided into the double beaker 50, and the fine particles 10 may be mixed with the acidic solution 20.

Accordingly, the first oxide layer 15 on the surface of each of the fine particles 10 may be removed by the acidic solution 20.

The acidic solution 20 may include or may be, for example, hydrochloric acid (HCl). For example, the acidic solution 20 may include or may be hydrochloric acid with a low concentration of, e.g., about 1M to about 3M to reduce the possibility that the fine particles 10 and the liquid metal 30 to be injected later are damaged by the acidic solution 20.

The fine particles 10 from which first oxide layers 15 on the surfaces thereof are removed in the acidic solution 20 may partially aggregate with each other. For example, some of the fine particles 10 may be clustered together after the first oxide layers 15 are removed from the fine particles 10.

Figure 3:
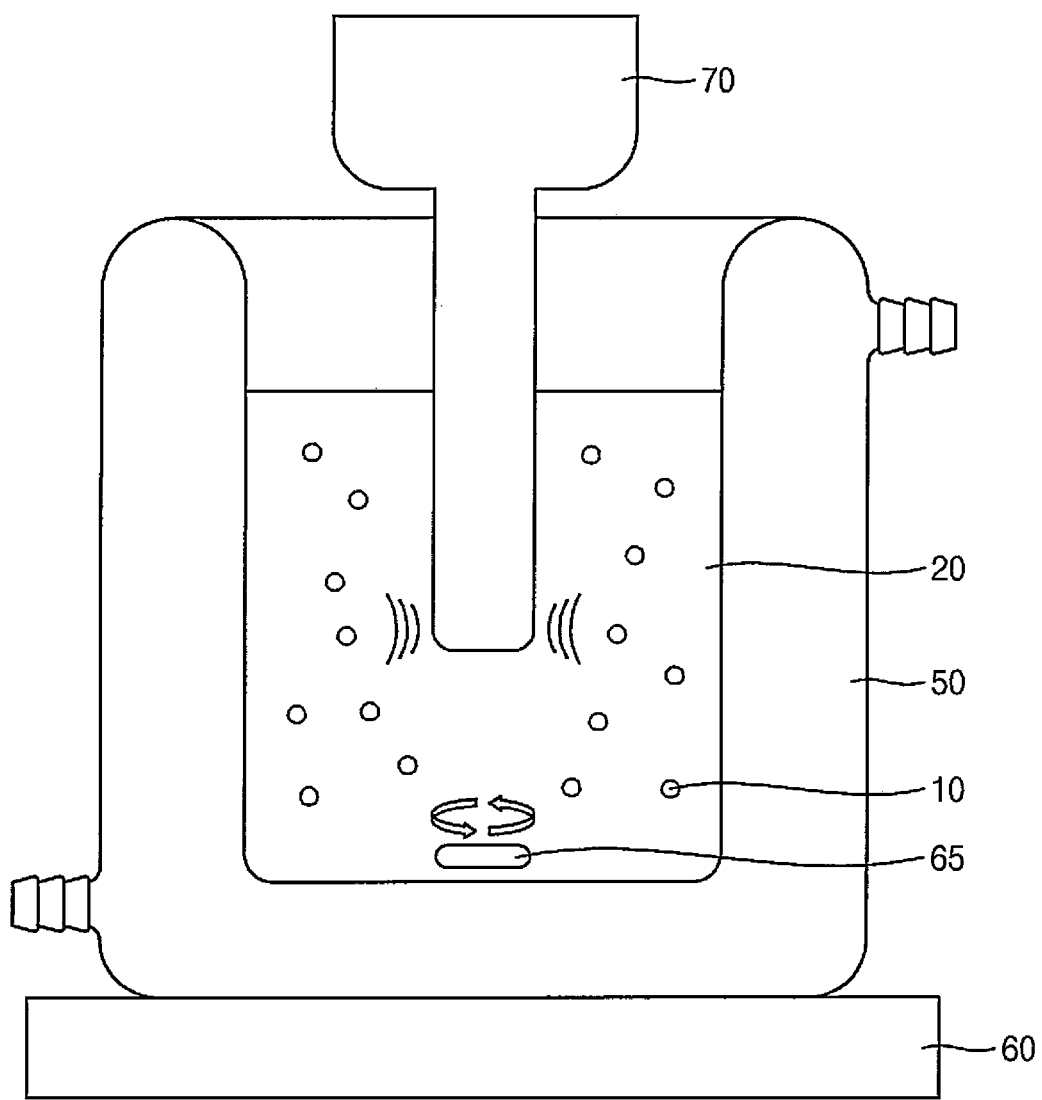

Referring to FIG. 3, the fine particles 10 may be dispersed in the acidic solution 20.

In example embodiments, the fine particles 10 may be dispersed in the acidic solution 20 by using a stirrer 60 and/or an ultrasonic disperser 70.

The stirrer 60 may be, e.g., a magnetic stirrer, and may be operated for, e.g., equal to or more than about 30 minutes.

The ultrasonic disperser 70 may be operated at an output power of equal to or more than about 500 W, e.g., at an output power of about 700 W, and at an interval of equal to or less than about 5 seconds, e.g., at an interval of about 5 seconds. If the ultrasonic disperser 70 is operated at a weak power of, e.g., less than about 500 W or at a large interval of, e.g., more than about 5 seconds, the fine particles 10 may not be sufficiently dispersed in the acidic solution 20.

Referring to FIG. 4, the liquid metal 30 may be injected into the acidic solution 20.

The liquid metal 30 may be exposed to the atmosphere so that a second oxide layer 35 may be formed on a surface of the liquid metal 30, however, the second oxide layer 35 may be removed from the surface of the liquid metal 30 by being injected into the acidic solution 20. For example, the liquid metal 30 may be exposed to ambient air before the liquid metal 30 is dropped into the acidic solution 20 so that a second oxide layer 35 may be formed on a surface of each drop/bead of the liquid metal 30. For example, the formation of the second oxide layer 35 may be unintentional.

The liquid metal 30 may be injected into the acidic solution 20 using, e.g., a micro pipette 80.

In example embodiments, the liquid metal 30 may be an alloy including gallium (Ga), indium (In) and/or tin (Sn). The alloy may include, e.g., about 60 wt % to about 80 wt % of gallium, about 12 wt % to about 40 wt % of indium, and about 0 wt % to about 20 wt % of tin. In one embodiment, the alloy may include about 66 wt % of gallium, about 22 wt % of indium, and about 12 wt % of tin. Since the alloy may have a melting point of about −19° C., it may exist in a liquid state at room temperature. For example, the liquid metal 30 may be maintained in a liquid state during the process of manufacturing the thermal interface material and after the manufacture of the thermal interface material.

While injecting the liquid metal 30 into the acidic solution 20, the stirrer 60 and the ultrasonic disperser 70 may be operated as described with reference to FIG. 3.

The number of beads of the liquid metal 30 injected into the acidic solution 20 is not limited to a certain number, and one or more beads of liquid metal 30 may be injected into the acidic solution 20.

Referring to FIG. 5, the fine particles 10 from which the first oxide layer 15 is removed in the acidic solution 20 may penetrate into the liquid metal 30 from which the second oxide layer 35 is removed. For example, the fine particles 10 may be rigid particles and may be maintained in a rigid state during the process of manufacturing the thermal interface material and after the manufacture of the thermal interface material. For example, the fine particles 10 may be rigid particles at room temperature.

The fine particles 10 may penetrate into the liquid metal 30 by a kind of phagocytosis. The process that the fine particles 10 penetrate into the liquid metal 30 may be called as a phagocytosis in the present disclosure in that the process resembles the phagocytosis shown in cells of organisms. As described above, since the first and second oxide layers 15 and 35 on the respective surfaces of the fine particles 10 and the liquid metal 30 may be removed by the acidic solution 20, the fine particles 10 may easily penetrate into the liquid metal 30. The phagocytosis may occur, e.g., for about 30 minutes.

In example embodiments, a volume percentage of the fine particles 10 in the liquid metal 30 including the fine particles 10 therein may be approximately 1% to 5%, preferably about 4%.

When the fine particles 10 penetrate into the liquid metal 30, bubbles 37 may be generated in the liquid metal 30.

When the fine particles 10 penetrate into the liquid metal 30, the stirrer 60 and the ultrasonic disperser 70 may still be operated.

FIG. 5 shows that four fine particles 10 penetrate into and are embedded in each bead of the liquid metal 30, however, the inventive concept is not limited thereto, and a larger or smaller number of the fine particles 10 may penetrate into and be embedded in each bead of the liquid metal 30.

Referring to FIG. 6, since the first and second oxide layers 15 and 35 on the respective surfaces of the fine particles 10 and the liquid metal 30 have been removed, each of the fine particles 10 may easily penetrate into the liquid metal 30 while contacting the surface of the liquid metal 30. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

For example, if the first and second oxide layers 15 and 35 on the respective surfaces of the fine particles 10 and the liquid metal 30 are not removed by the acidic solution 20 and the fine particles 10 and the liquid metal 30 are mixed in the atmosphere, an interfacial thermal resistance may be generated between the fine particles 10 and the liquid metal 30 by the first and second oxide layers 15 and 35, and a surface energy barrier therebetween may be increased by the first and second oxide layers 15 and 35, so that it may be difficult for the fine particles 10 to penetrate into the liquid metal 30. For example, the first and second oxide layers 15 and 35 may form a barrier such that the fine particles 10 may not penetrate into the liquid metal 30. The first and second oxide layers 15 and 35 may cause thermal resistance such that thermal conductivity may be reduced in a thermal interface material formed with the fine particles 10 and the liquid metal 30.

However, as described above, the first and second oxide layers 15 and 35 on the respective surfaces of the fine particles 10 and the liquid metal 30 may be removed by the acidic solution 20, and thus the interfacial thermal resistance may not be generated between the fine particles 10 and the liquid metal 30 by the first and second oxide layers 15 and 35 and the surface energy therebetween may not increase, so that the fine particles 10 may easily penetrate into the liquid metal 30 while overcoming the surface energy with the liquid metal 30.

Figure 7:
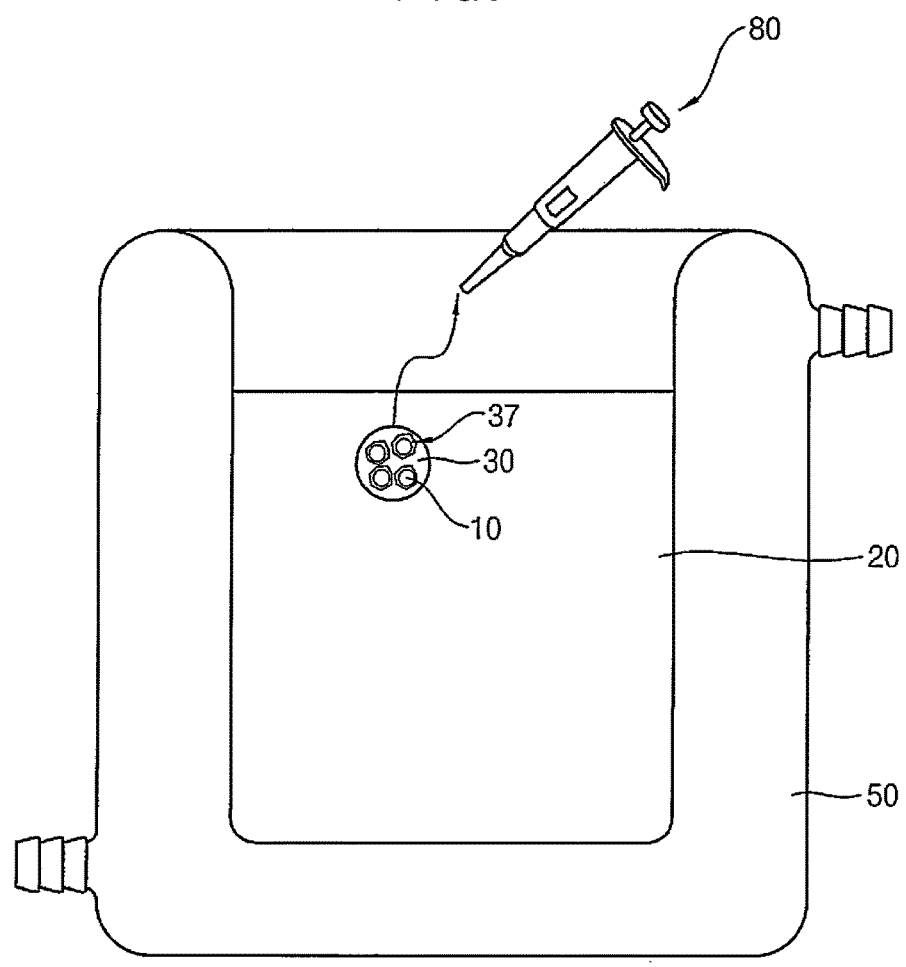

Referring to FIG. 7, the liquid metal 30 including the fine particles 10 may be extracted from the acidic solution 20.

In one embodiment, extracting the liquid metal 30 including the fine particles 10 therein may be performed using the micro pipette 80.

Figure 8:
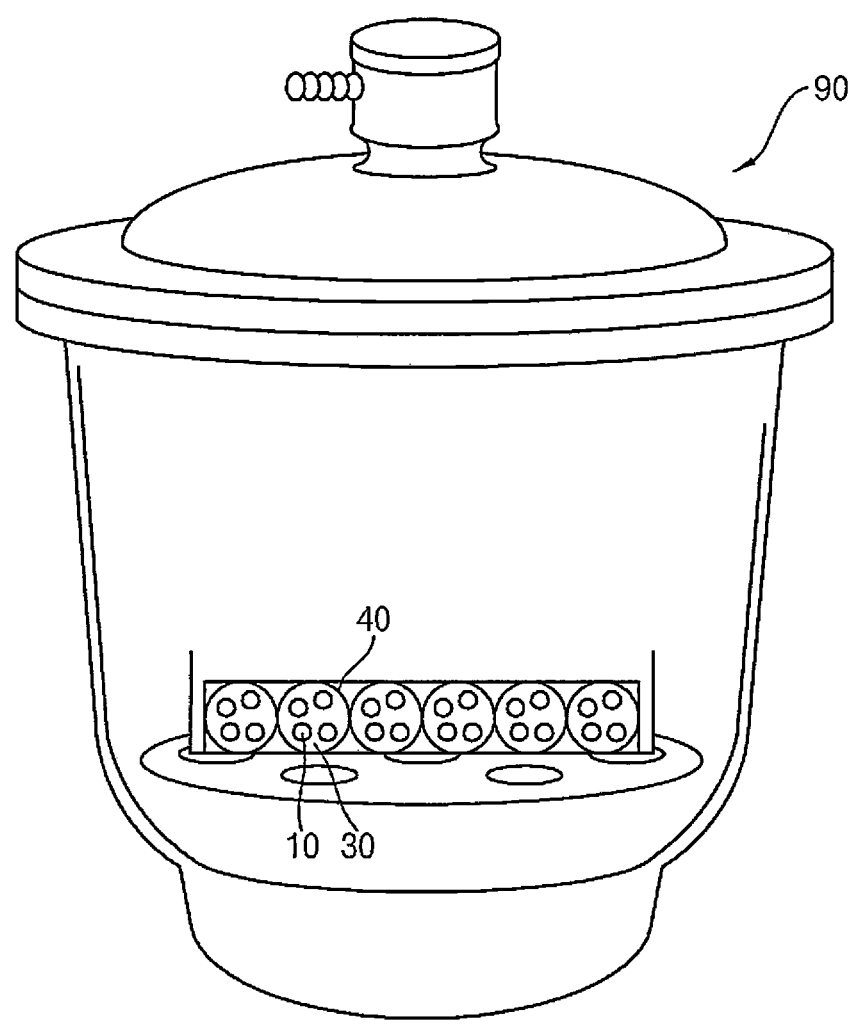

Referring to FIG. 8, the bubbles 37 in the liquid metal 30 including the fine particles 10 therein may be removed.

In one embodiment, removing the bubbles 37 from the liquid metal 30 including the fine particles 10 therein may be performed using a desiccator 90 in which a vacuum state is maintained, and, for example, the bubbles 37 may be removed from the liquid metal 30 by placing the liquid metal 30 including the fine particles 10 therein into the desiccator 90 and keeping the liquid metal 30 in a vacuum state for about 3 hours.

A thermal interface material 40 may be manufactured by performing the above described processes.

Figure 9:
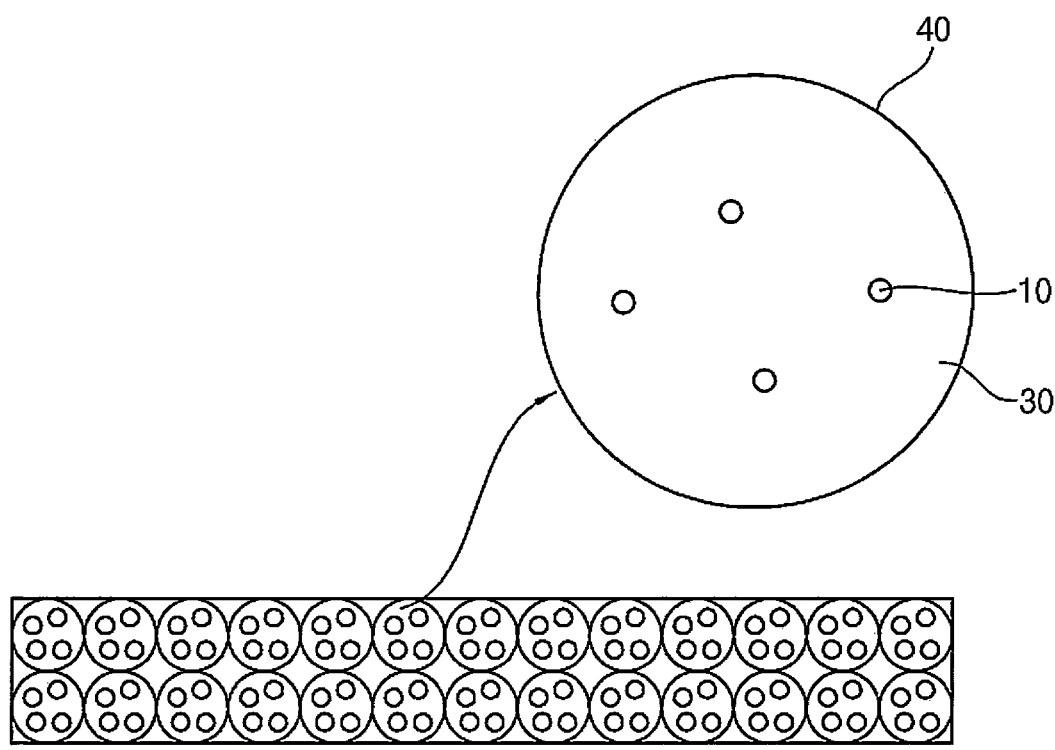
FIG. 9 is a cross-sectional view illustrating the thermal interface material manufactured in accordance with example embodiments.

FIG. 9 is a cross-sectional view illustrating the thermal interface material manufactured in accordance with example embodiments.

Referring to FIG. 9, the thermal interface material 40 may include the liquid metal 30 and the fine particles 10 disposed inside the liquid metal 30 and having no oxide layer on surfaces of the fine particles 10 and the liquid metal 30. For example, the fine particles 10 may be enclosed in the liquid metal beads 30 and surrounded by the liquid metal 30. In certain embodiments, the liquid metal beads 30 may not have clear boundaries between the liquid beads 30 but get together and be a chunk of liquid metal layer.

In example embodiments, a plurality of thermal interface materials 40 may be arranged in a horizontal direction to form one layer, and a plurality of the layers may be arranged in a vertical direction.

Hereinafter, features of the thermal interface material 40 manufactured by the above described processes may be explained with reference to FIGS. 10 to 15.

Figure 10:
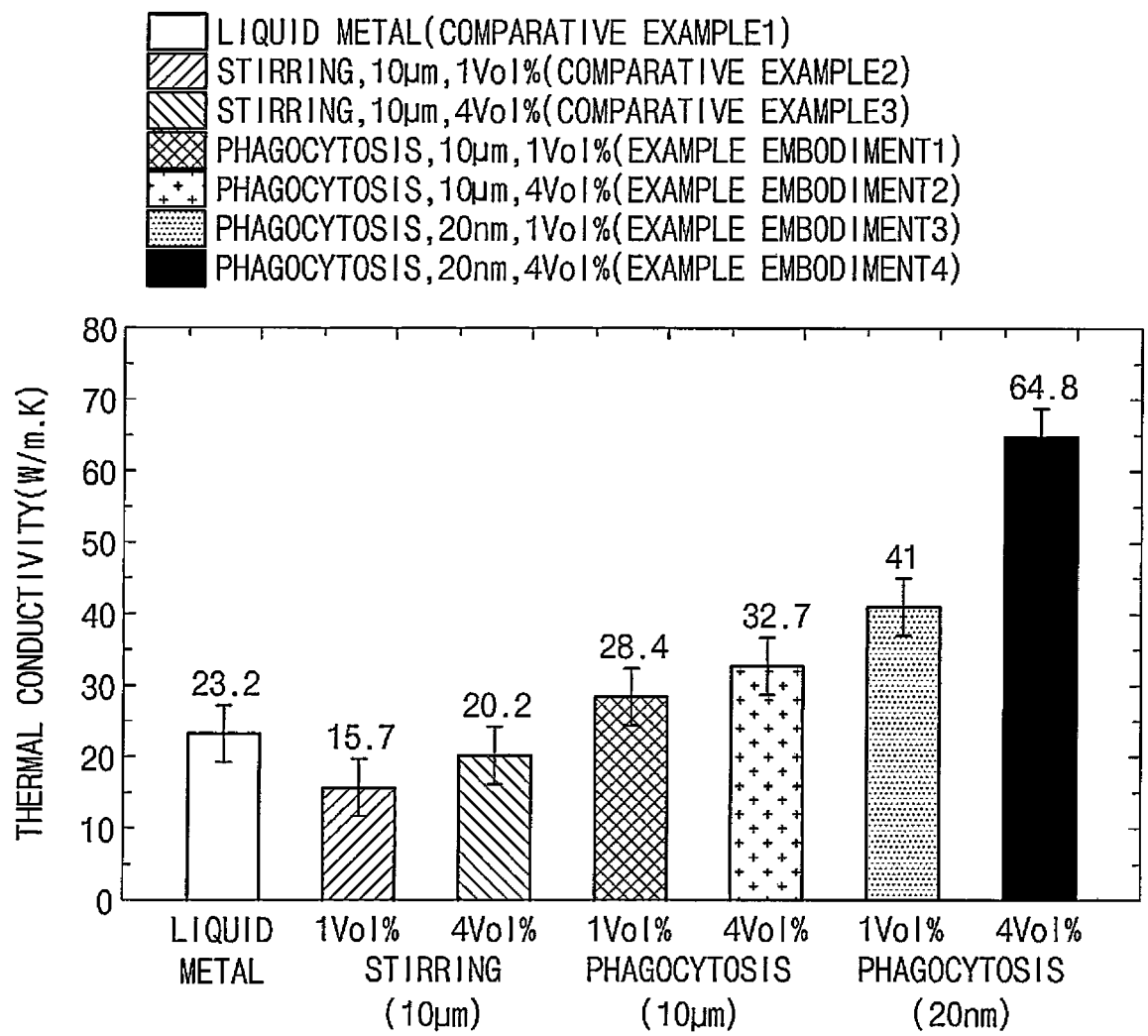
FIGS. 10, 11A and 11B are graphs illustrating thermal conductivities of thermal interface materials manufactured in accordance with example embodiments and thermal interface materials manufactured in accordance with comparative examples.
Figure 11A:
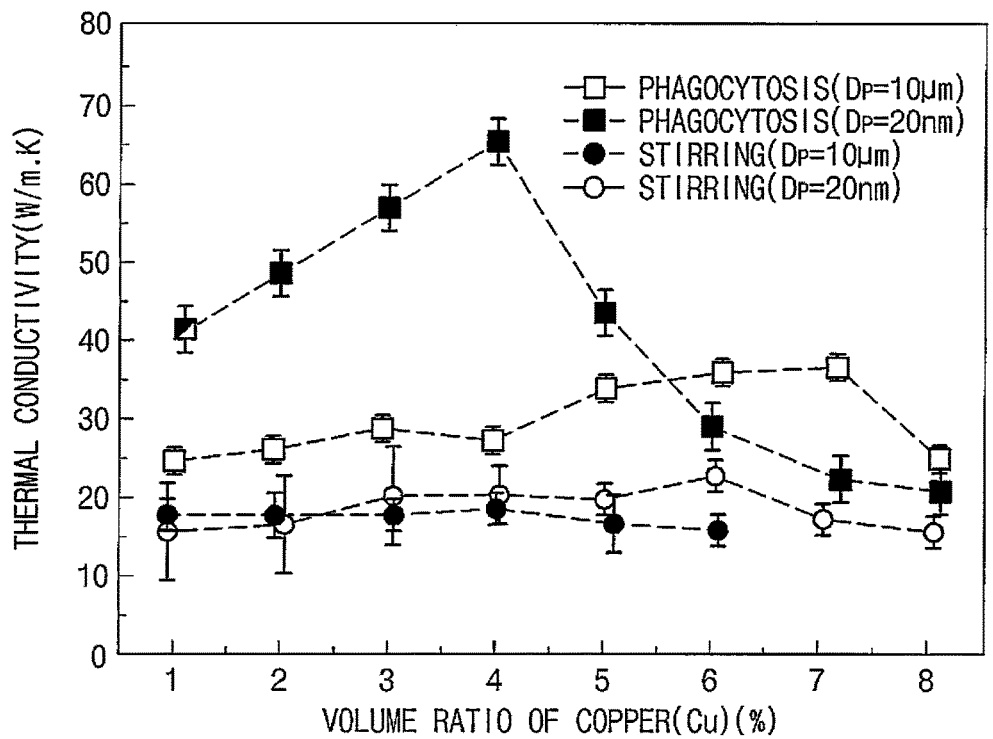
Figure 11B:
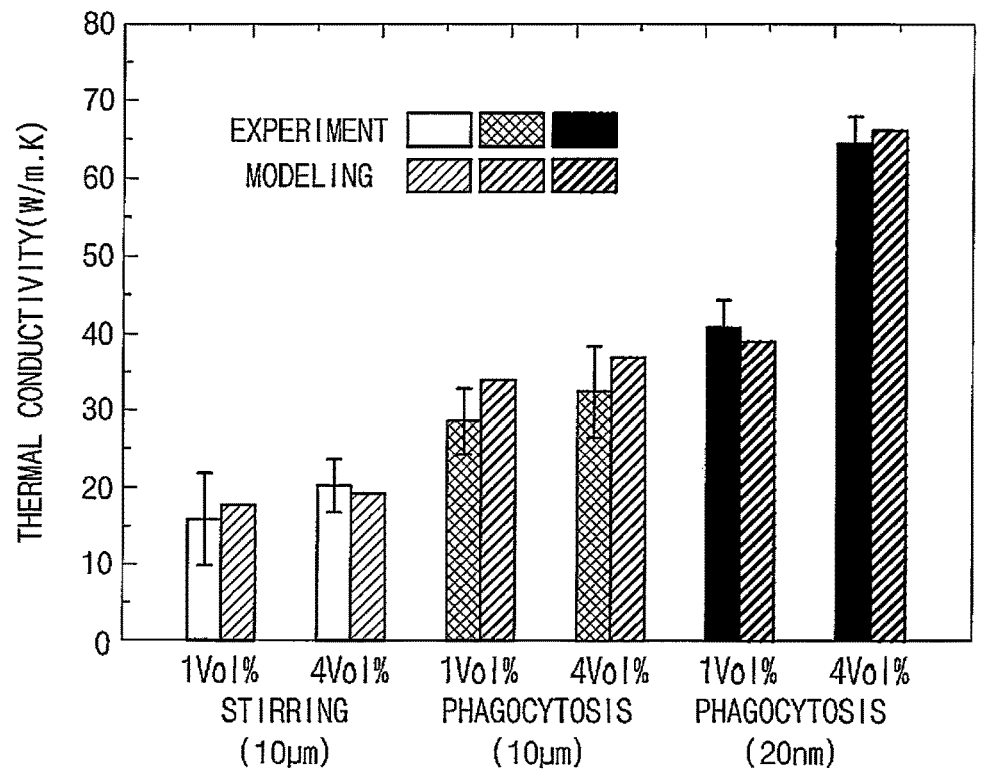

FIGS. 10, 11A and 11B are graphs illustrating thermal conductivities of thermal interface materials manufactured in accordance with example embodiments and thermal interface materials manufactured in accordance with comparative examples.

FIG. 10 shows results of experiments for measuring a thermal conductivity of a liquid metal including no fine particles therein (comparative example 1), a liquid metal including fine particles of micro-size (10 μm) therein by stirring (comparative examples 2 and 3), a liquid metal including fine particles of micro-size (10 μm) therein by phagocytosis (example embodiments 1 and 2), and a liquid metal including fine particles of nano-sized (20 nm) therein by phagocytosis (example embodiments 3 and 4). In comparative example 2 and example embodiments 1 and 3, a volume percentage of the fine particles in each bead of the liquid metals is about 1%, and in comparative example 3 and example embodiments 2 and 4, a volume percentage of the fine particles in each bead of the liquid metals is about 4%.

Referring to FIG. 10, thermal conductivities of the thermal interface materials in accordance with the example embodiments 1 to 4 are greater than those of the thermal interface materials in accordance with the comparative examples 1 to 3.

For example, the liquid metals including the fine particles therein by stirring in comparative examples 2 and 3 have thermal conductivities (15.7 W/m·K and 20.2 W/m·K) lower than that (23.2 W/m·K) of the liquid metal including no fine particles therein in comparative example 1, even though the volume percentage of the fine particles in the liquid metals is increased to about 4%.

The liquid metals in example embodiments 1 and 2 have thermal conductivities of 28.4 W/m·K and 32.7 W/m·K, respectively, which are greater than the thermal conductivity of the liquid metal in comparative example 1 by 5.25 W/m·K and 9.5 W/m·K, respectively.

The liquid metals in example embodiments 3 and 4 have thermal conductivities of 41 W/m·K and 64.8 W/m·K, respectively, and the thermal conductivity of the liquid metal in example embodiment 4 is about 2.8 times the thermal conductivity of the liquid metal in comparative example 1.

FIG. 11A shows that thermal conductivities of liquid metals change as volume percentages of fine particles increase from about 1% to about 8% in liquid metals including micro-sized (10 μm) and nano-sized (20 nm) fine particles, respectively, by stirring and in liquid metals including micro-sized (10 μm) and nano-sized (20 nm) fine particles, respectively, by phagocytosis. The fine particles are copper particles.

Referring to FIG. 11A, a thermal conductivity of the liquid metal 30 including the fine particles 10 by phagocytosis is greater than a thermal conductivity of a liquid metal including fine particles by stirring. For example, the liquid metal 30 including nano-sized (20 nm) fine particles 10 by phagocytosis has a thermal conductivity of equal to or more than 40 W/m·K in a range of about 1% to about 5% of a volume percentage of the fine particles 10, which is about twice the thermal conductivity of the liquid metal including the fine particles by stirring. The liquid metal 30 including the nano-sized (20 nm) fine particles 10 by phagocytosis has a maximum thermal conductivity when the volume percentage of the fine particles 10 is approximately 4%.

FIG. 11B shows experimental values of thermal conductivities of the liquid metals shown in FIG. 11A and values calculated through modeling to verify the thermal conductivities.

First, the experimental value of the thermal conductivity of the liquid metal including the fine particles by stirring may be verified by the following Maxwell-Garnet effective medium theory modeling calculation formula.

$$k_{eff} = k_m[1+3f(r/a_k-1)/(r/a_k+2)]$$

In the Maxwell-Garnet effective medium theory modeling calculation formula, $k_{eff}$ is an effective thermal conductivity, $k_m$ is a thermal conductivity of the liquid metal, f is a volume ratio of the fine particles to the liquid metal including the fine particles therein, r is a radius of each of the fine particles, and $a_k$ is Kapitza radius. The Kapitza radius $a_k$ refers to a product by a thermal conductivity $k_m$ of the liquid metal and $R_b$, which is a quotient of a thickness δ of an interface between the fine particles and the liquid metal and a thermal conductivity $k_i$ of the interface between the fine particles and the liquid metal.

A value of the thermal conductivity at about 1% or about 4% of the volume percentage of the fine particles in the liquid metal including the fine particles therein, which is calculated according to the Maxwell-Garnet effective medium theory modeling calculation formula, is similar to the experimentally measured value of the thermal conductivity of the liquid metal including the fine particles therein by stirring.

Next, the experimental value of the thermal conductivity of the liquid metal 30 including the micro-sized fine particles 10 therein by phagocytosis may be verified by the following Nielsen theory modeling calculation formula.

$$k_{eff} = k_m \left[ \frac{(1+ABf)}{(1-\varphi Bf)} \right], B = \frac{k_p/k_m - 1}{k_p/k_m + A}, \varphi = 1 + \frac{(1-\phi_{max})f}{\phi_{max}^2}$$

the Nielsen theory modeling calculation formula, $k_{eff}$ is an effective thermal conductivity, $k_m$ is a thermal conductivity of the liquid metal 30, $k_p$ is a thermal conductivity of the micro-sized fine particles 10, and f is a volume ratio of the micro-sized fine particles 10 to the liquid metal 30 including the micro-sized fine particles 10 therein, $\phi_{max}$ the maximum ratio of the micro-sized fine particles 10 to the liquid metal 30 including the micro-sized fine particles 10 therein, A is a value determined based on a shape of the micro-sized fine particles 10, and B and φ are values defined in the above calculation formula. The micro-sized fine particles 10 have a value of about 0.64 and A has a value of about 1.5, assuming that the micro-sized fine particles 10 are spherical copper (Cu) particles.

A value of the thermal conductivity at about 1% or about 4% of the volume percentage of the micro-sized fine particles 10 in the liquid metal 30 including the micro-sized fine particles 10 therein, which is calculated according to the Nielsen theory modeling calculation formula, is similar to the experimentally measured value of the thermal conductivity of the liquid metal 30 including the micro-sized fine particles 10 therein by the phagocytosis.

Next, the experimental value of the thermal conductivity of the liquid metal 30 including the nano-sized fine particles 10 therein by phagocytosis may be verified by the following Clustering modeling calculation formula.

$$k_{eff} = k_m \left[ \frac{3 + \phi_c(2\beta_{11}(1-L_{11}) + \beta_{33}(1-L_{33}))}{3 - \phi_c(2\beta_{11}L_{11} + \beta_{33}L_{33})} \right], \phi_c = \frac{f}{\phi_{c_p}}$$

$$L_{11} = \frac{0.5Q^2}{Q^2-1} - \frac{0.5Q\cosh^{-1}Q}{([Q^2-1])^{1.5}} \quad L_{33} = 1 - L_{11}$$

$$\beta_{11} = \frac{k_{11}^c - k_b}{k_b + L_{11}(k_{11}^c - k_b)} \quad \beta_{33} = \frac{k_{33}^c - k_b}{k_b + L_{33}(k_{33}^c - k_b)}$$

$$k_{11}^c = \frac{k_c}{1 + \frac{rL_{11}k_c}{k_b}} \quad k_{33}^c = \frac{k_c}{1 + \frac{rL_{33}k_c}{k_b}}$$

$$r = \frac{\left(2 + \frac{1}{Q}\right)R_{Bd}k_b}{d_p}$$

In the Clustering modeling calculation formula, $k_{eff}$ is an effective thermal conductivity, $k_m$ is a thermal conductivity of the liquid metal 30, $k_p$ is a thermal conductivity of nano-sized fine particles 10, and f is a volume ratio of the nano-sized fine particles 10 to the liquid metal 30 including the nano-sized fine particles 10 therein, $\phi_c$ is a ratio occupied by a cluster formed by an agglomeration of the nano-sized fine particles 10 in the liquid metal 30 including the nano-sized fine particles 10 therein, $\phi_{c_p}$ is a ratio occupied by the nano-sized fine particles 10 in the cluster and the liquid metal 30 surrounded by the cluster, Q is an aspect ratio of the cluster, $k_c$ is a thermal conductivity of the cluster, $R_{Bd}$ is an interfacial thermal resistance between the fine particles 10 and the liquid metal 30, and $L_{11}$, $L_{33}$, $\beta_{11}$, $\beta_{33}$, $k^c_{11}$, $k^c_{33}$ and r are values defined in the above calculation formula.

A value of the thermal conductivity at about 1% or about 4% of the volume percentage of the nano-sized fine particles 10 in the liquid metal 30 including the nano-sized fine particles 10 therein, which is calculated according to the Clustering modeling calculation formula, is similar to the experimentally measured value of the thermal conductivity of the liquid metal 30 including the nano-sized fine particles 10 therein by phagocytosis.

As described above, since the experimental value of the thermal conductivity and the value of the thermal conductivity calculated according to the modeling calculation formula are similar to each other, the experimental value of the thermal conductivity is reliable.

Figure 12:
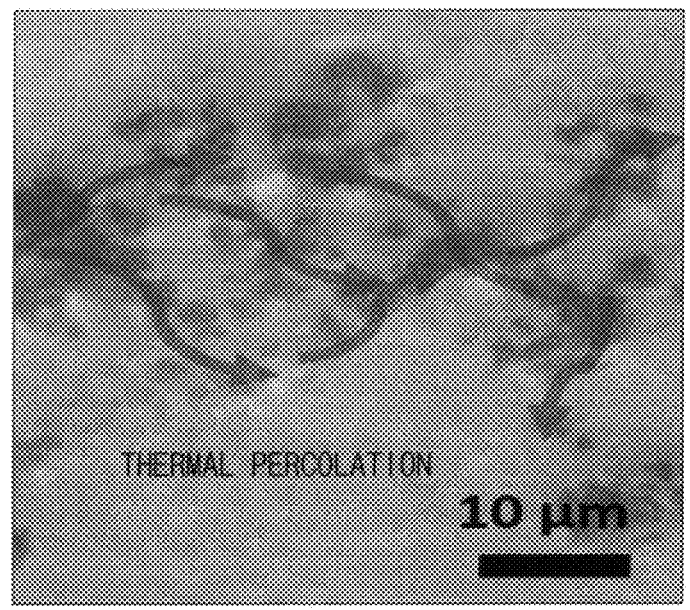
FIG. 12 is an inverted microscopic image illustrating a thermal interface material manufactured in accordance with example embodiments.

FIG. 12 is an inverted microscopic image illustrating a thermal interface material manufactured in accordance with example embodiments.

Referring to FIG. 12, the fine particles 10 may be partially aggregated in the thermal interface material 40 manufactured in accordance with example embodiments to form a cluster.

A thermal network may be formed in the thermal interface material 40 due to the cluster formation. Accordingly, heat may be easily transferred within the thermal interface material 40 along a thermal percolation, so that the thermal conductivity may be improved.

However, if a volume percentage of the fine particles 10 in the liquid metal 30 including the fine particles 10 therein is less than about 1%, the number of the fine particles 10 is too small to form the cluster, and thus a thermal network may not be formed so that the thermal conductivity may be lowered. If the volume percentage is higher than about 5%, the clusters may be aggregated with each other, and thermal percolation may not be properly formed, so that the thermal conductivity may be lowered. Accordingly, if the volume percentage of the fine particles 10 in the liquid metal 30 including the fine particles 10 is within a range of about 1% to about 5%, the thermal interface material 40 may have high thermal conductivity.

Figure 13:
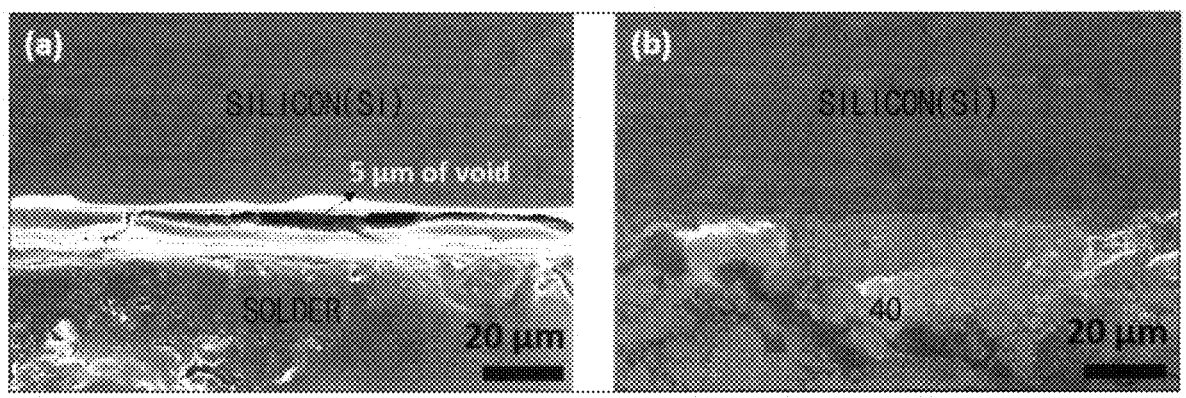
FIG. 13 is a scanning electron microscopic (SEM) image illustrating interfacial adhesion of a thermal interface material manufactured in accordance with example embodiments.

FIG. 13 is a scanning electron microscopic (SEM) image illustrating interfacial adhesion of a thermal interface material manufactured in accordance with example embodiments.

FIG. 13 shows a SEM image of an interface between a thermal interface material and silicon (Si).

FIG. 13 (a) is a photograph of an interface between silicon and solder after applying solder including about 60 wt % of lead (Pb) and about 40 wt % of tin (Sn), which is a conventional thermal interface material, onto silicon. Solder has a low interfacial adhesion with silicon, and thus a void of about 5 μm was formed therebetween, and accordingly, interfacial adhesion therebetween was difficult and/or not good.

FIG. 13 (b) is a photograph of an interface between silicon and the thermal interface material 40 after applying the thermal interface material 40 manufactured in accordance with example embodiments onto silicon. The thermal interface material 40 has a high (or good) adhesion with silicon, and thus voids were not formed therebetween, and accordingly, interfacial adhesion therebetween was easy.

For example, solder including about 60 wt % of lead and about 40 wt % of tin, which is the conventional thermal interface material, requires a process of depositing a solderable metal layer including, e.g., copper (Cu) or gold (Au) on silicon to increase the interfacial adhesion, and thus the interfacial adhesion is complicated and the interfacial adhesion cost increases. However, the thermal interface material 40 manufactured in accordance with example embodiments may have a high interfacial adhesion with silicon, and thus an additional deposition process may not be required, so that the interfacial adhesion may be simplified and the interfacial adhesion cost may decrease.

Figure 14:
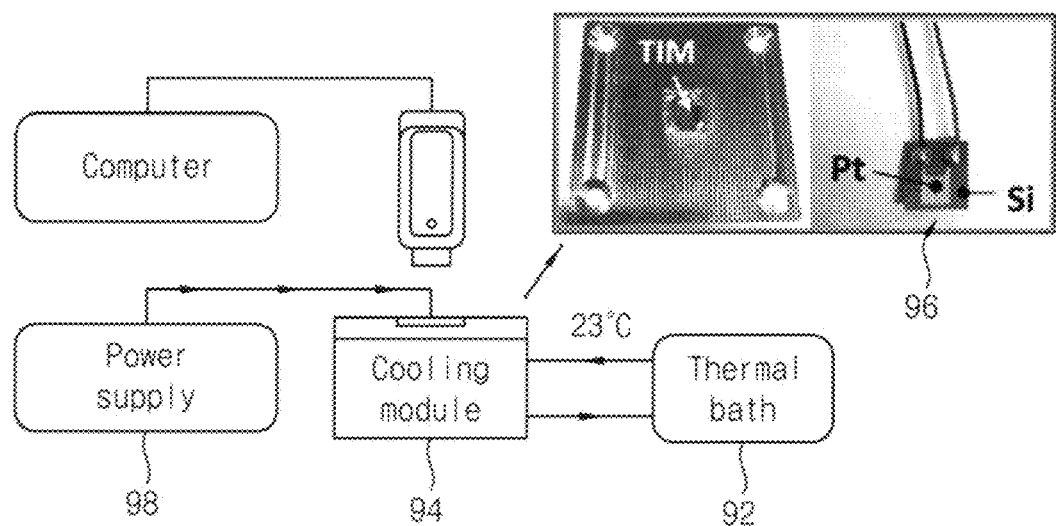
FIG. 14 is a schematic diagram of a setup of an experiment for measuring a thermal resistance of the thermal interface material manufactured in accordance with example embodiments and an image of microheater.
Figure 15:
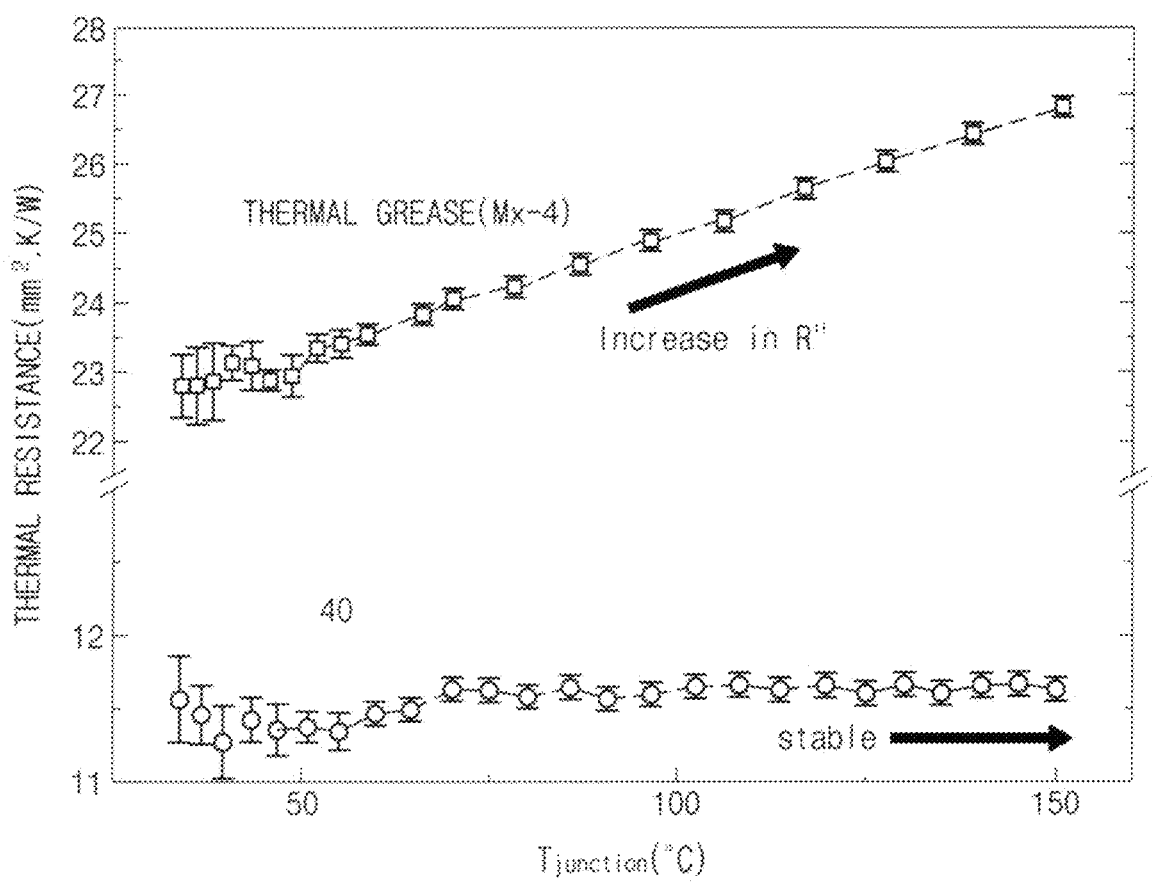
FIG. 15 is a graph illustrating a thermal resistance of the thermal interface material in accordance with the experiment.

FIG. 14 is a schematic diagram of a setup of an experiment for measuring a thermal resistance of the thermal interface material manufactured in accordance with example embodiments and an image of microheater, and FIG. 15 is a graph illustrating a thermal resistance of the thermal interface material in accordance with the experiment.

Referring to FIG. 14, a temperature of a low temperature portion of a cooling module 94 was kept constant by providing a cooling water of a thermal bath 92 maintained at about 23° C. to the cooling module 94. After applying a thermal grease, a conventional thermal interface material, or the thermal interface material 40 manufactured in accordance with example embodiments onto a copper (Cu) plate installed in the low temperature portion of the cooling module 94, a silicon-based microheater 96 was attached thereto. Then, a temperature of the microheater 96 was measured by a thermal imaging camera while controlling a voltage applied to the microheater 96 through a power supply 98.

As shown in the following calculation formula, a heat resistance R″ of the thermal grease or the thermal interface material 40 may be calculated by dividing a heat flux q″ by a difference between a maximum temperature $T_{heater}$ of the microheater 96 and a temperature of the cooling water $T_{coolant}$.

$$R''=q''/(T_{heater}-T_{coolant})$$

FIG. 15 is a graph of thermal resistance values of the thermal grease and the thermal interface material 40 calculated according to the above calculation formula.

Referring to FIG. 15, the thermal grease has a thermal resistance of about 22.7 mm$^2$·K/W at room temperature due to the low thermal conductivity and voids are generated at an interface due to the decrease of viscosity as the temperature increases, and thus the thermal grease has a thermal resistance of equal to or more than about 26.5 mm$^2$·K/W at a high temperature of 150° C. On the other hand, the thermal interface material 40 manufactured in accordance with example embodiments has a thermal resistance of about 11.7 mm$^2$·K/W at room temperature due to the high thermal conductivity and a low heat resistance of 11.7 mm$^2$·K/W is maintained even at a high temperature of 150° C.

For example, the thermal interface material 40 may have a low thermal resistance due to the high thermal conductivity, and may have a high temperature stability in which a low thermal resistance is maintained even at a high temperature.

As a result, as shown in FIGS. 10 to 15, the thermal interface material 40 manufactured in accordance with example embodiments may have a high thermal conductivity, a good interfacial adhesion, a low thermal resistance, and an improved high temperature stability.

Figure 16:
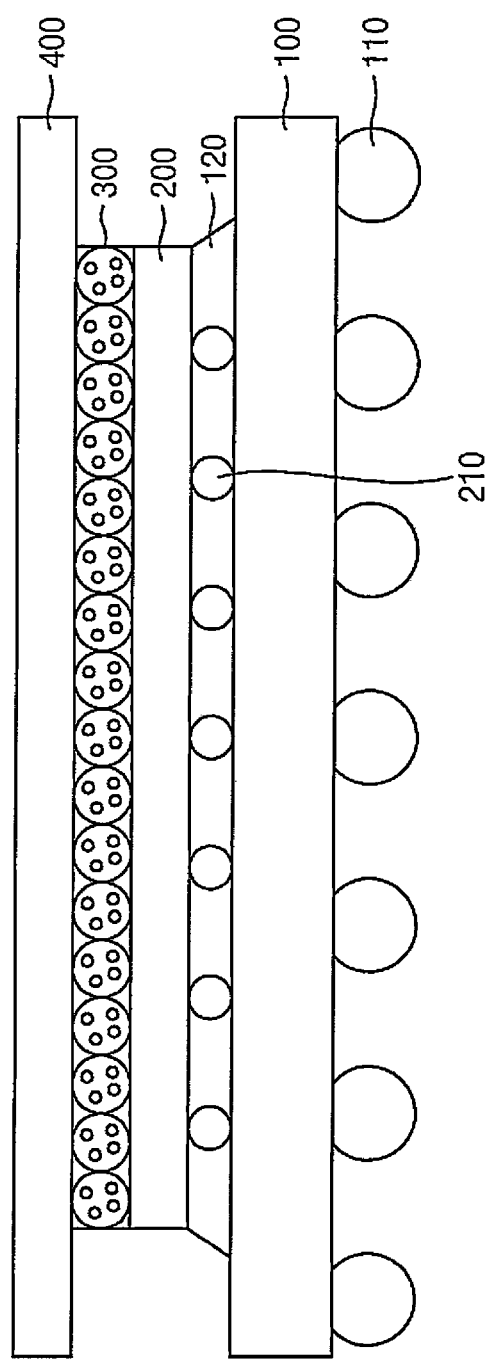
FIGS. 16 and 17 are cross-sectional views illustrating semiconductor packages including a thermal interface material manufactured in accordance with example embodiments.
Figure 17:
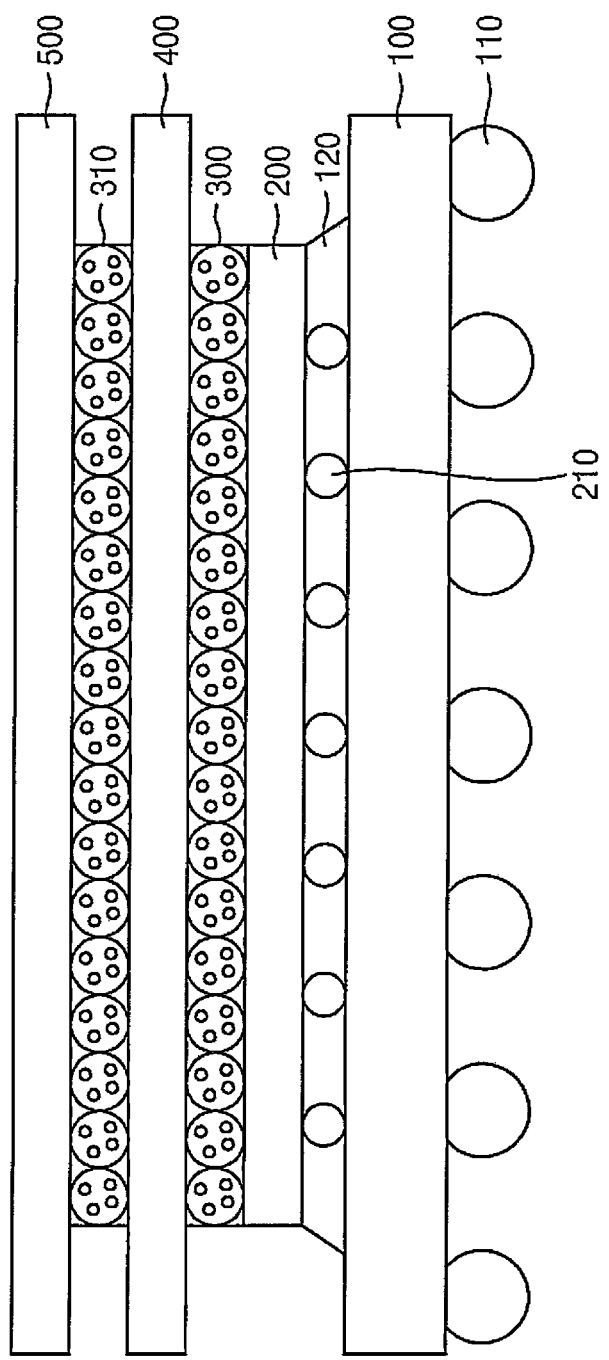

FIGS. 16 and 17 are cross-sectional views illustrating semiconductor packages including a thermal interface material manufactured in accordance with example embodiments. Each of the semiconductor packages includes a thermal interface material substantially the same as or similar to that manufactured by the above method described with reference to FIGS. 1 to 8, of which characteristics are described with reference to FIGS. 9 to 15, and thus repeated explanations are omitted herein.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Referring to FIG. 16, the semiconductor package may include a package substrate 100, a semiconductor chip 200 on the package substrate 100, a heat dissipation member 400 on the semiconductor chip 200, and a first thermal interface material 300 coated on an upper surface of the semiconductor chip 200 and bonding the semiconductor chip 200 and the heat dissipation member 400 with each other. Further, the semiconductor package may include a conductive bump 210, an adhesive 120, and an external connection member 110.

The package substrate 100 may be, e.g., a printed circuit board (PCB). The PCB may be a multilayer circuit board having vias and various circuits therein.

The external connection member 110 may be disposed on a lower surface of the package substrate 100, through which the semiconductor package may be electrically connected to an external device. An external connection pad (not shown) connected to the external connection member 110 may be disposed in the package substrate 100. The external connection member 110 may include or may be, e.g., a solder ball. The semiconductor package may be mounted on a module substrate (not shown) via the external connection member 110 to compose a memory module.

The semiconductor chip 200 may be mounted onto the package substrate 100 by, e.g., a flip chip bonding method. The package substrate 100 and the semiconductor chip 200 may be bonded to each other by the adhesive 120 disposed therebetween. The adhesive 120 may include or may be, e.g., an epoxy material.

The conductive bump 210 may be disposed through the adhesive 120 to electrically connect the package substrate 100 and the semiconductor chip 200 with each other. The conductive bump 210 may contact a substrate pad (not shown) of the package substrate 100 and a chip pad (not shown) of the semiconductor chip 200, thereby electrically connecting the package substrate 100 and the semiconductor chip 200 to each other. For example, the substrate pad may be formed on a top surface of the package substrate 100, and the chip pad may be formed on a bottom surface of the semiconductor chip 200.

The conductive bump 210 may include or may be, e.g., a micro bump, a solder bump, a solder ball, etc. The conductive bump 210 may be formed of a metal or a combination of metals such as copper (Cu), nickel (Ni), tin (Sn), tin/silver (Sn/Ag), tin/copper (Sn/Cu), tin/indium (Sn/In), etc., but is not limited thereto.

The semiconductor chip 200 may be electrically connected to the package substrate 100 by bonding wires (not shown).

The heat dissipation member 400 may be disposed on the semiconductor chip 200, through which heat generated from the semiconductor chip 200 may be easily discharged outwardly. Accordingly, the heat dissipation member 400 may include or may be formed of a conductive material having good thermal conductivity, e.g., copper (Cu), aluminum (Al), silver (Ag), tin (Sn), gold (Au), nickel (Ni), Lead (Pb), titanium (Ti), or an alloy thereof.

The heat dissipation member 400 may have various components depending on the usage and structure of the semiconductor package, and for example, may include or may be a heat spreader, a heat pipe, a liquid cooled cold plate, etc.

FIG. 16 shows that the heat dissipation member 400 has a planar area corresponding to (e.g., the same as) the package substrate 100, however, the inventive concept is not limited thereto, and the heat dissipation member 400 may have a wider or narrower planar area than that of the package substrate 100.

The first thermal interface material 300 may be substantially the same as or similar to the thermal interface material 40 shown in FIG. 9. The first thermal interface material 300 may have a high thermal conductivity, a good interfacial adhesion, a low thermal resistance, and an improved high temperature stability when compared to the conventional thermal interface material, and thus the heat generated from the semiconductor chip 200 may be easily transferred to the heat dissipation member 400 through the first thermal interface material 300 and discharged outwardly, so that the semiconductor package may have an improved cooling performance.

Referring to FIG. 17, the semiconductor package may further include a heat sink 500 on the heat dissipation member 400 and a second thermal interface material 310 coated on an upper surface of the heat dissipation member 400 and bonding the heat dissipation member 400 and the heat sink 500 with each other. For example, the semiconductor package of FIG. 17 may have a structure having the heat sink 500 bonded with the second thermal interface material 310 on the heat dissipation member 400 in the semiconductor package described with reference to FIG. 16.

The heat sink 500 may be disposed on the heat dissipation member 400. Heat generated from the semiconductor chip 200 may be easily discharged outwardly through the heat dissipation member 400 and the heat sink 500. The heat sink 500 may include or may be formed of a conductive material having a good thermal conductivity, e.g., copper (Cu), aluminum (Al), silver (Ag), tin (Sn), gold (Au), nickel (Ni), Lead (Pb), titanium (Ti), or an alloy thereof.

FIG. 17 shows that the heat sink 500 has a planar area corresponding to (e.g., the same as) the package substrate 100, however, the inventive concept is not limited thereto, and the heat sink 500 may have a wider or narrower planar area than that of the package substrate 100.

The second thermal interface material 310 may be substantially the same as or similar to the thermal interface material 40 shown in FIG. 9. The second thermal interface material 310 may have a high thermal conductivity, a good interfacial adhesion, a low thermal resistance, and an improved high temperature stability when compared to the conventional thermal interface material, and thus the heat transferred to the heat dissipation member 400 may be easily transferred to the heat sink 500 through the second thermal interface material 310 and discharged outwardly, so that the semiconductor package may have an improved cooling performance.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

While example embodiments have been particularly shown and described, it will be understood by one of ordinary skill in the art that variations in form and detail may be made therein without departing from the spirit and scope of the claims.

What is claimed is:

1. A method of manufacturing a thermal interface material, comprising:
   mixing fine particles with an acidic solution to remove a first oxide layer from a surface of each of the fine particles;
   injecting a liquid metal into the acidic solution to remove a second oxide layer from a surface of the liquid metal, the fine particles from which the first oxide layer is removed in the acidic solution penetrating into the liquid metal from which the second oxide layer is removed; and
   extracting the liquid metal including the fine particles therein from the acidic solution.

2. The method as claimed in claim 1, wherein the liquid metal is an alloy including gallium (Ga), indium (In) and/or tin (Sn).

3. The method as claimed in claim 2, wherein the alloy includes about 60 wt % to about 80 wt % gallium (Ga), about 12 wt % to about 40 wt % indium (In), and about 0 wt % to about 20 wt % tin (Sn).

4. The method as claimed in claim 1, wherein the fine particles have a thermal conductivity greater than that of the liquid metal.

5. The method as claimed in claim 4, wherein the fine particles include copper (Cu) or silver (Ag).

6. The method as claimed in claim 1, wherein the acidic solution includes hydrochloric acid.

7. The method as claimed in claim 1, wherein each of the fine particles is spherical or elliptical, and has a diameter of about 20 nm to about 100 μm.

8. The method as claimed in claim 7, wherein the diameter of each of the fine particles is about 20 nm.

9. The method as claimed in claim 1, wherein a volume percentage of the fine particles in the liquid metal including the fine particles therein is about 1% to about 5%.

10. The method as claimed in claim 1, further comprising, after removing the first oxide layer from the surface of each of the fine particles, dispersing the fine particles in the acidic solution.

11. The method as claimed in claim 10, wherein dispersing the fine particles in the acidic solution is performed using a stirrer and an ultrasonic disperser.

12. The method as claimed in claim 1, further comprising, after extracting the liquid metal including the fine particles therein from the acidic solution, removing bubbles in the liquid metal including the fine particles therein.

13. A method of manufacturing a thermal interface material, comprising:
   mixing fine particles with an acidic solution;
   injecting a liquid metal into the acidic solution to remove an oxide layer from a surface of the liquid metal, the fine particles in the acidic solution penetrating into the liquid metal from which the oxide layer is removed; and
   extracting the liquid metal including the fine particles therein from the acidic solution; and
   removing bubbles in the liquid metal including the fine particles therein.

14. The method as claimed in claim 13, wherein removing the bubbles in the liquid metal including the fine particles therein includes placing the liquid metal in a desiccator and keeping the liquid metal in a vacuum state.

15. The method as claimed in claim 13, wherein the liquid metal is an alloy including gallium (Ga), indium (In) and/or tin (Sn).

16. The method as claimed in claim 13, wherein the fine particles have a thermal conductivity greater than that of the liquid metal.

17. The method as claimed in claim 16, wherein the fine particles include copper (Cu) or silver (Ag).

18. The method as claimed in claim 13, wherein the acidic solution includes hydrochloric acid.

19. A method of manufacturing a semiconductor package, comprising:
   bonding a semiconductor chip on an upper surface of a package substrate;
   mixing fine particles with an acidic solution to remove a first oxide layer from a surface of each of the fine particles;
   injecting a liquid metal into the acidic solution to remove a second oxide layer from a surface of the liquid metal, the fine particles from which the first oxide layer is removed in the acidic solution penetrating into the liquid metal from which the second oxide layer is removed;
   extracting the liquid metal including the fine particles therein from the acidic solution to manufacture a thermal interface material;
   coating the thermal interface material on an upper surface of the semiconductor chip; and
   placing a heat dissipation member on the thermal interface material.

20. The method as claimed in claim 19, further comprising:
   coating the thermal interface material on an upper surface of the heat dissipation member; and
   placing a heat sink on the heat dissipation member.

* * * * *